(12) United States Patent
Jin et al.

(10) Patent No.: US 8,497,154 B2
(45) Date of Patent: Jul. 30, 2013

(54) SOLAR CELL SYSTEM MANUFACTURING METHOD

(75) Inventors: Yuan-Hao Jin, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/572,765

(22) Filed: Aug. 13, 2012

(65) Prior Publication Data
US 2013/0157402 A1   Jun. 20, 2013

(30) Foreign Application Priority Data
Dec. 16, 2011 (CN) .......................... 2011 1 0421935

(51) Int. Cl.
*H01L 21/00* (2006.01)

(52) U.S. Cl.
USPC .................... 438/80; 438/66; 257/E21.351

(58) Field of Classification Search
USPC ............. 438/63, 74, 329, 356; 257/E21.041, 257/E21.042, E21.351, E21.352, E21.363
See application file for complete search history.

(56) References Cited

U.S. PATENT DOCUMENTS
2011/0259409 A1* 10/2011 Naito et al. .................. 136/255

* cited by examiner

*Primary Examiner* — Cheung Lee
(74) *Attorney, Agent, or Firm* — Altis Law Group, Inc.

(57) ABSTRACT

A method for manufacturing a solar cell system includes the following steps. First, a number of P-N junction cell preforms are provided. The number of the P-N junction cell preforms is M. The M P-N junction cell preforms is named from a first P-N junction cell preform to a Mth P-N junction cell preform. Second, the M P-N junction cell preforms are arranged along a straight line. Third, an inner electrode preform is formed between each two adjacent P-N junction cell preforms, wherein at least one inner electrode is a carbon nanotube array. Axial directions of the carbon nanotubes in the carbon nanotube array are parallel to the straight line.

17 Claims, 5 Drawing Sheets

SOLAR CELL SYSTEM MANUFACTURING METHOD

CROSS-REFERENCE TO RELATED APPLICATIONS

This application claims all benefits accruing under 35 U.S.C. §119 from China Patent Application No. 201110421935.3, filed on Dec. 16, 2011, in the China Intellectual Property Office, the contents of which are hereby incorporated by reference. This application is related to applications entitled, "SOLAR CELL SYSTEM", U.S. application Ser. No. 13/572,766 filed on Aug. 13, 2012; "SOLAR CELL SYSTEM", U.S. application Ser. No. 13/572,769 filed on Aug. 13, 2012.

BACKGROUND

1. Technical Field

The present disclosure relates to a solar cell system and a method for making the same.

2. Description of Related Art

An operating principle of a solar cell is the photoelectric effect of a semiconducting material. The solar cells can be roughly classified into silicon-based solar cells, gallium arsenide solar cells, and organic thin film solar cells.

A silicon-based solar cell usually includes a rear electrode, a P-type silicon layer, an N-type silicon layer, and a front electrode. The P-type silicon layer can be made of polycrystalline silicon or monocrystalline silicon and has a first surface and a flat second surface opposite to the first surface. The rear electrode is disposed on and in ohmic contact with the first surface of the P-type silicon layer. The N-type silicon layer is formed on the second surface of the P-type silicon layer and serves as a photoelectric conversion element. The N-type silicon layer has a flat surface. The front electrode is disposed on the flat surface of the N-type silicon layer. The P-type silicon layer and the N-type silicon layer cooperatively form a P-N junction near an interface of the P-type silicon layer and the N-type silicon layer. In use, light directly irradiates the front electrode, and reaches the P-N junction through the front electrode and the N-type silicon layer. Consequently, a plurality of electron-hole pairs (carriers) can be generated in the P-N junction due to photon excitation. Electrons and holes in the electron-hole pairs can be separated from each other and separately move toward the rear electrode and the front electrode under an electrostatic potential. If a load is connected between the front electrode and the rear electrode, a current can flow through the load.

However, a light absorbing efficiency of the P-N junction of the above solar cell is low, because photons in the incident light are partially absorbed by the front electrode and the N-type silicon layer. Thus, the number of carriers generated by exciting of photons in the P-N junction may be low, and a photoelectric conversion efficiency of the solar cell is relatively low.

What is needed, therefore, is to provide a solar cell having high photoelectric conversion efficiency.

BRIEF DESCRIPTION OF THE DRAWING

Many aspects of the present disclosure can be better understood with reference to the following drawings. The components in the drawings are not necessarily to scale, the emphasis instead being placed upon clearly illustrating the principles of the present embodiments.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
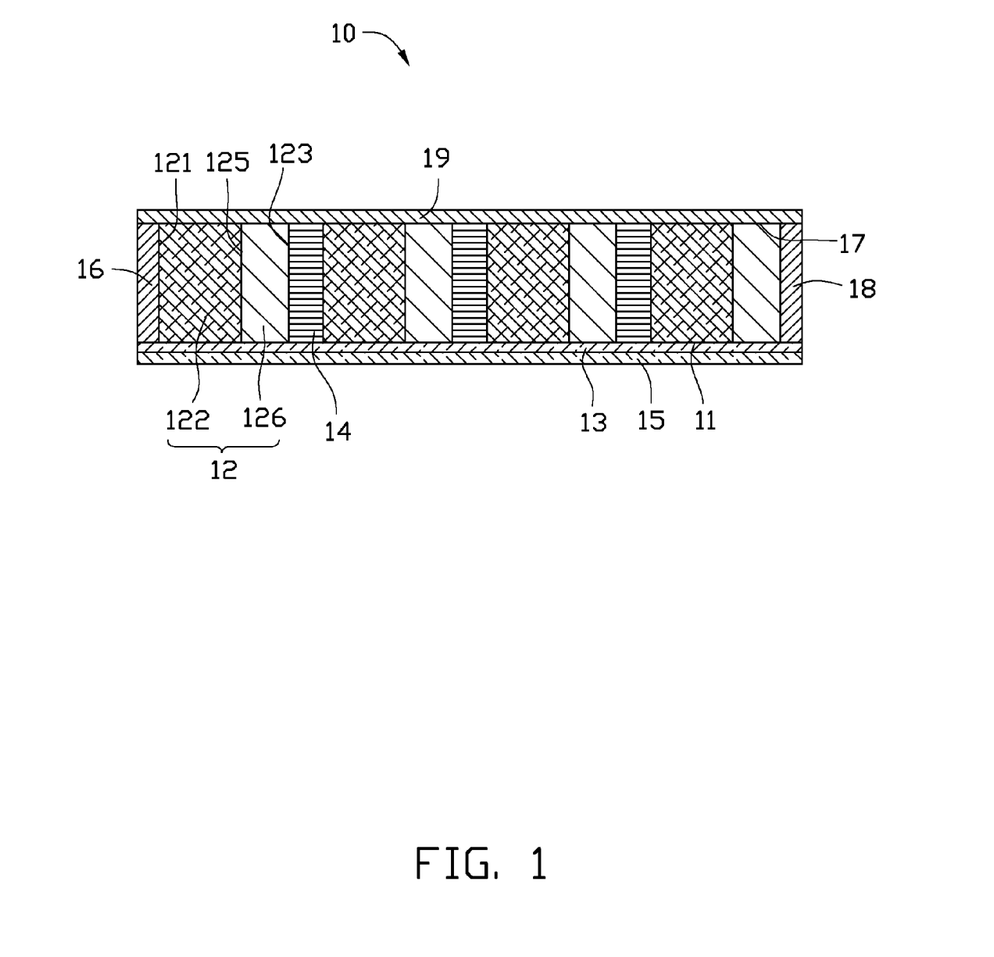
FIG. 1 is a front view of one embodiment of a solar cell system.
Figure 2:
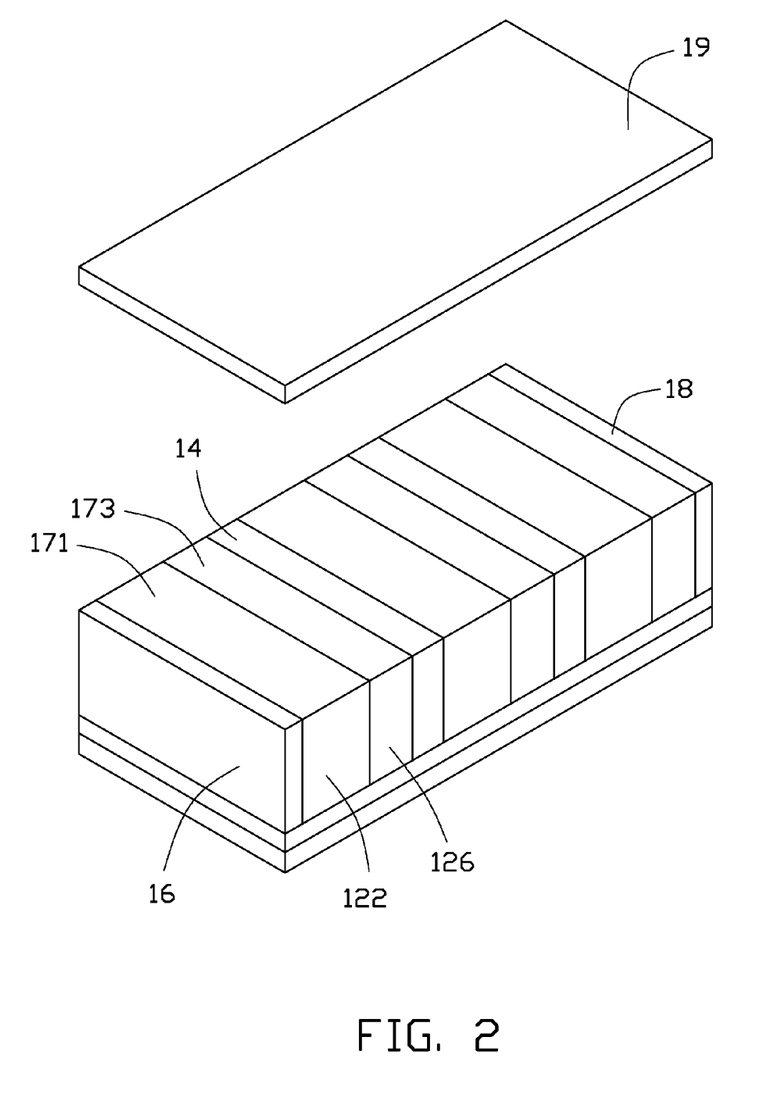
FIG. 2 is a structural schematic view of one embodiment of a solar cell system.

Referring to FIGS. 1 and 2, one embodiment of a solar cell system 10 includes a number of P-N junction cells 12, a number of inner electrodes 14, a first collecting electrode 16, and a second collecting electrode 18. The number of the P-N junction cells 12 is M. M is a natural number. M is equal to or greater than 2. In one embodiment, the M is 100. The number of the inner electrodes 14 is M−1. The P-N junction cells 12 are arranged in series along a straight line. The M P-N junction cells 12 are arranged from a first P-N junction cell to an Mth P-N junction cell along the straight line. The M P-N junction cells 12 are connected in series via the M−1 inner electrodes 14. The solar cell system 10 has a photoreceptive surface 17. The photoreceptive surface 17 is parallel to the straight line. The photoreceptive surface 17 is used to directly receive the incident light.

Each of the number of P-N junction cells 12 includes a first silicon layer 122 and a second silicon layer 126. The first silicon layer 122 and the second silicon layer 126 are arranged side by side and in contact with each other. Each of the number of P-N junction cells 12 includes a first surface 121, a second surface 123, and a contacting surface 125. A surface of the first silicon layer 122 far from the second silicon layer 126 is defined as the first surface 121. A surface of the second silicon layer 126 far from the first silicon layer 122 is defined as the second surface 123. The first silicon layer 122 and the second silicon layer 126 are in contact with each other on the contacting surface 125. The second surface 123 is opposite to the first surface 121. The first surface 121, the second surface 123 and the contacting surface 125 are spaced from and parallel to each other. A P-N junction is formed near the contacting surface 125 between the first silicon layer 122 and second silicon layer 126. The first collecting electrode 16 is located on the first surface 121 of the first P-N junction cell. The second collecting electrode 18 is located on the second surface 123 of the Mth P-N junction cell. At least one of the inner electrodes 14 is a carbon nanotube array. In one embodiment, each of the inner electrodes 14 is a carbon nanotube array. The carbon nanotube array is located between adjacent two of the P-N junction cells 12 along the straight line. The carbon nanotube array includes a number of carbon nanotubes. The carbon nanotubes are substantially parallel to each other. Each of the carbon nanotubes includes a first end and a second end. First ends of the carbon nanotubes are connected to a first surface 121 of one of the P-N junction cells 12. Second ends of the carbon nanotubes are connected to the second surface 123 of another one of the P-N junction cells 12 which is adjacent to the one of the P-N junction cells 12. The carbon nanotubes extend from the first surface 121 of one of the P-N junction cells 12 to the second surface 123 of another one of the P-N junction cells 12 which is adjacent to the one of the P-N junction cells 12 along axial directions of carbon nanotubes.

The M P-N junction cells 12, the M−1 inner electrodes 14, the first collecting electrode 16 and the second collecting electrode 18 are arranged along the straight line and in contact with each other to obtain an integrated structure. The M P-N junction cells 12 can be arranged side by side or dislocated. Here, "arranged side by side" mean P-N junction cells 12 are overlapped each other entirely, "dislocated" mean P-N junction cells 12 are partially overlapped only. If the M P-N junction cells 12 are arranged side by side, the photoreceptive surfaces of the M P-N junction cells 12 are coplanar. If the M P-N junction cells 12 are dislocated, the photoreceptive surfaces of the M P-N junction cells 12 are spaced apart from each other and a portion of each of the inner electrodes 14 is exposed. The exposed portion of each of the inner electrodes 14 can also be used to receive the incident light to enhance a photoelectric conversion efficiency.

The first silicon layer 122 may be a P-type silicon layer or an N-type silicon layer. The second silicon layer 126 may also be a P-type silicon layer or an N-type silicon layer. The type of the first silicon layer 122 is different from the second silicon layer 126. In one embodiment, the first silicon layer 122 is a P-type silicon layer, the second silicon layer 126 is an N-type silicon layer.

Each first silicon layer 122 has a first top surface 171 connected to the fist surface 121 and the contacting surface 125. Each of the second silicon layers 126 has a second top surface 173 connected to the second surface 123 and the contacting surface 125. The first top surface 171 and the second top surface 173 are coplanar and used as the photoreceptive surface 17. The P-type silicon layer and the N-type silicon layer near the P-N junction are exposed from the photoreceptive surface 17.

The first silicon layer 122 may be a laminar structure. The first silicon layer 122 may be made of a single crystal silicon or a multicrystal silicon. A thickness of the first silicon layer 122 is a distance between the contacting surface 125 and the first surface 121. The thickness of the first silicon layer 122 is in a range from about 200 nanometers to about 300 micrometers. In one embodiment, the thickness of first silicon layer 122 is about 200 nanometers. A first angle is formed between the contacting surface 125 and the first top surface 171. The first angle is greater than 0 degrees and less than 180 degrees. A second angle is formed between the first surface 121 and the first top surface 171. The second angle is greater than 0 degrees and less than 180 degrees. In one embodiment, the first angle is about 90 degrees and the second angle is about 90 degrees.

The second silicon layer 126 may be a laminar structure. The second silicon layer 126 can be formed by injecting superfluous N-type doping elements (e.g. phosphorus or arsenic) into a silicon sheet. A thickness of the second silicon layer 126 is a distance between the contacting surface 125 and the second surface 123. The thickness of the second silicon layer 126 is about 10 nanometers to 1 micrometer. In one embodiment, the thickness of the second silicon layer 126 is about 50 nanometers. A third angle is formed between the contacting surface 125 and the second top surface 173. The third angle is greater than 0 degrees and less than 180 degrees. A fourth angle is formed between the second surface 123 and the second top surface 173. The fourth angle is greater than 0 degrees and less than 180 degrees. In one embodiment, the third angle is about 90 degrees and the fourth angle is about 90 degrees.

An inner electric field having a field direction from the N-type silicon layer to P-type silicon layer is formed, because surplus electrons in the N-type silicon layer diffuse across the P-N junction and reach the P-type silicon layer. When a plurality of electron-hole pairs are generated in the P-N junction due to excitation of an incident light, the electrons and the holes are separated from each other under the inner electric field. Specifically, the electrons in the N-type silicon layer move toward the second collecting electrode 18, and are gathered by the second collecting electrode 18. The holes in the P-type silicon layer move toward the first collecting electrode 16, and are gathered by the first collecting electrode 16. Thus, a current power is formed between the first collecting electrode 16 and the second collecting electrode 18, thereby realizing a conversion from the light energy to the electrical energy. The M P-N junction cells 12 are connected in series via the M−1 inner electrodes 14. The voltage of the solar cell system 10 is a sum of M P-N junction cells 12. A current flow in each of the P-N junction cells 12 is the same.

The first collecting electrode 16 and the second collecting electrode 18 are used to collect the current produced in the inner of the solar cell system 10. The power can be applied to an external load through wires. The first collecting electrode 16 and the second collecting electrode 18 can be opaque to avoid leakage of the incident light passing through the first collecting electrode 16 and the second collecting electrode 18, thus the photoelectric conversion efficiency of the solar cell system 10 is improved.

The first collecting electrode 16 will not obstruct the light to irradiate the P-N junction. The first collecting electrode 16 can be a continuous planar shaped structure, a network shaped structure or a lattice shaped structure. The first collecting electrode 16 is located on the entire or a portion of the first surface 121. A material of the first collecting electrode 16 is conductive material, such as metal, conducting polymer, indium tin oxide, or carbon nanotube array. In one embodiment, the first collecting electrode 16 is made of a metal layer having a continuous planar shaped structure and coated on the entirety of the first surface 121. The metal can be aluminum, copper, or silver. A thickness of the first collecting electrode 16 is not limited, and can be in a range from about 50 nanometers to about 300 nanometers. In one embodiment, the first collecting electrode 16 is an aluminum sheet having a thickness of about 200 nanometers.

The second collecting electrode 18 will not obstruct the light to irradiate the P-N junction. The second collecting electrode 18 can be a continuous planar shaped structure, a network shaped structure or a lattice shaped structure. The second collecting electrode 18 is coated on the entire or a portion of the second surface 123. A material of the second collecting electrode 18 is conductive material, such as metal, conducting polymer, indium tin oxide, or carbon nanotube array. The material of the second collecting electrode 18 can be the same as or different form the first collecting electrode 16. In one embodiment, the second collecting electrode 18 is made of a metal layer having a continuous planar shaped structure and coated on the entirety of the second surface 123. The metal can be aluminum, copper, or silver. A thickness of the second collecting electrode 18 is not limited, and can be in a range from about 50 nanometers to about 300 nanometers. In one embodiment, the second collecting electrode 18 is an aluminum sheet having a thickness of about 200 nanometers.

The inner electrodes 14 may be carbon nanotube array, metal layer, conducting polymer layer, or indium tin oxide layer. The metal can be aluminum, copper, or silver. The carbon nanotube array includes a number of carbon nanotubes. Adjacent two of the P-N junction cells 12 are connected to each other by the carbon nanotube array. Ends of a majority of carbon nanotubes in the carbon nanotube array are connected to the first surface 121 of one of the P-N junction cells 12 of the adjacent two of the P-N junction cells 12. The other ends of the majority of carbon nanotubes in the carbon nanotube array are connected to a second surface 123 of another one of the P-N junction cells 12 of the two of the P-N junction cells 12. Ends of a few carbon nanotubes may not connected to both of the first surface 121 and the second surface 123, or ends of a few carbon nanotubes may be connected to only one of the first surface 121 and the second surface 123 due to a limitation of manufacturing method and manufacturing condition.

Figure 3:
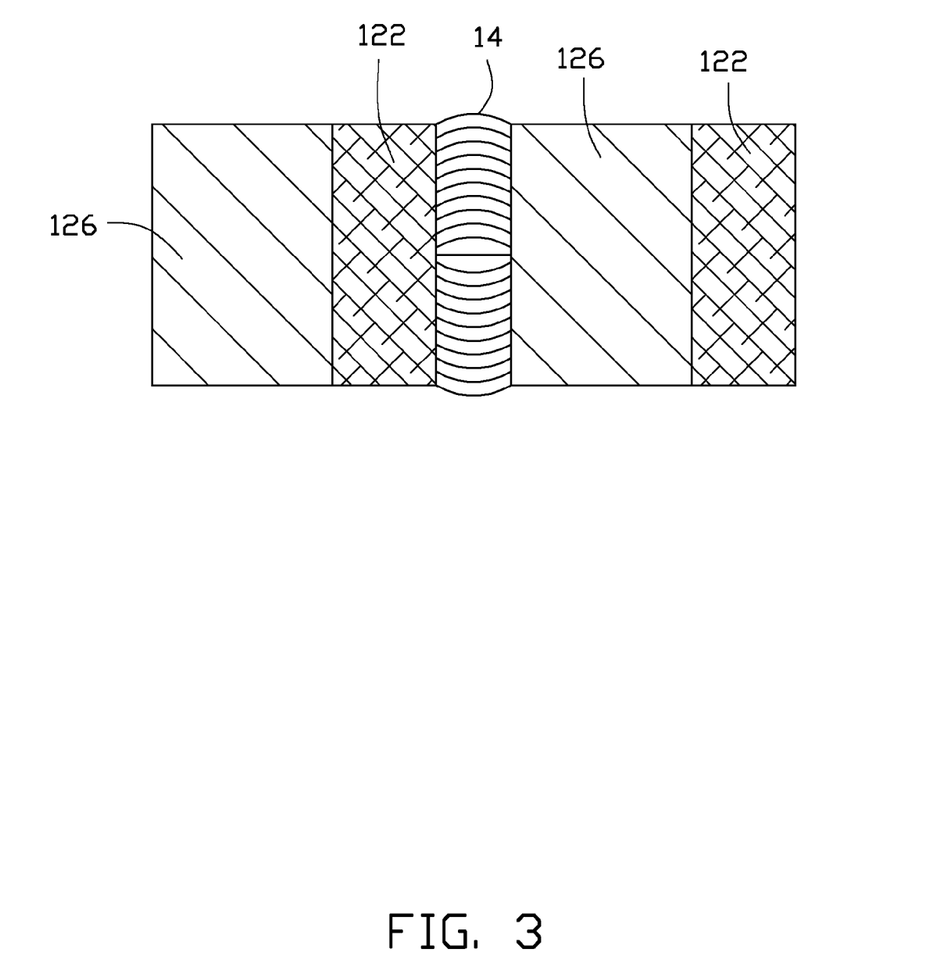
FIG. 3 is a partial, enlarged view of one embodiment of a solar cell system.

The carbon nanotubes located between adjacent two of the P-N junction cells 12 can be straight or curved. Referring to FIG. 1, the carbon nanotubes are straight and substantially parallel to each other in one embodiment. A few carbon nanotubes in FIG. 1 may be not straight and not parallel to other carbon nanotubes because of manufacturing method and manufacturing condition. Referring to FIG. 3, the carbon nanotubes are curved in one embodiment. That means that the carbon nanotubes extend along a curved line. A shape of the curved line may be bow-shaped or S-shaped. Curved lines of each carbon nanotubes may be different. A portion of carbon nanotubes may be bent toward a first direction. The other portion of carbon nanotubes may be bent toward a second direction.

The carbon nanotube array may be composed of pure carbon nanotubes with few impurities and chemical functional groups. The carbon nanotube array may be a super-aligned carbon nanotube array in one embodiment. The carbon nanotubes may be single-walled, double-walled, multi-walled carbon nanotubes. Lengths of carbon nanotubes in the carbon nanotube array are not limited. In one embodiment, lengths of carbon nanotubes may be about 100 micrometers to about 400 micrometers. In one embodiment, lengths of carbon nanotubes may be about 150 micrometers. A diameter of a single-walled carbon nanotube is in a range from about 0.5 nanometers to about 50 nanometers. A diameter of a double-walled carbon nanotube is in a range from about 1.0 nanometer to 50 nanometers. A diameter of a multi-walled carbon nanotube is in a range from about 1.5 nanometers to about 50 nanometers.

The carbon nanotube array is an open-ended carbon nanotube array. The open-ended carbon nanotube array is composed of open-ended carbon nanotubes. The open-ended carbon nanotubes have an uncovered terminal/tip with an internal cavity exposed. The conductivity of the open-ended carbon nanotubes is better than that of the close-ended carbon nanotubes. The close-ended carbon nanotubes have a terminal/tip capped with a fullerene semi-sphere. Therefore, the photoelectric conversion efficiency of the solar cell system 10 is improved.

The carbon nanotubes in the carbon nanotube array can be metallic carbon nanotubes. The conductivity of the metallic carbon nanotubes is better than the semi-conductor carbon nanotubes. Therefore, the photoelectric conversion efficiency of the solar cell system 10 is improved.

Figure 4:
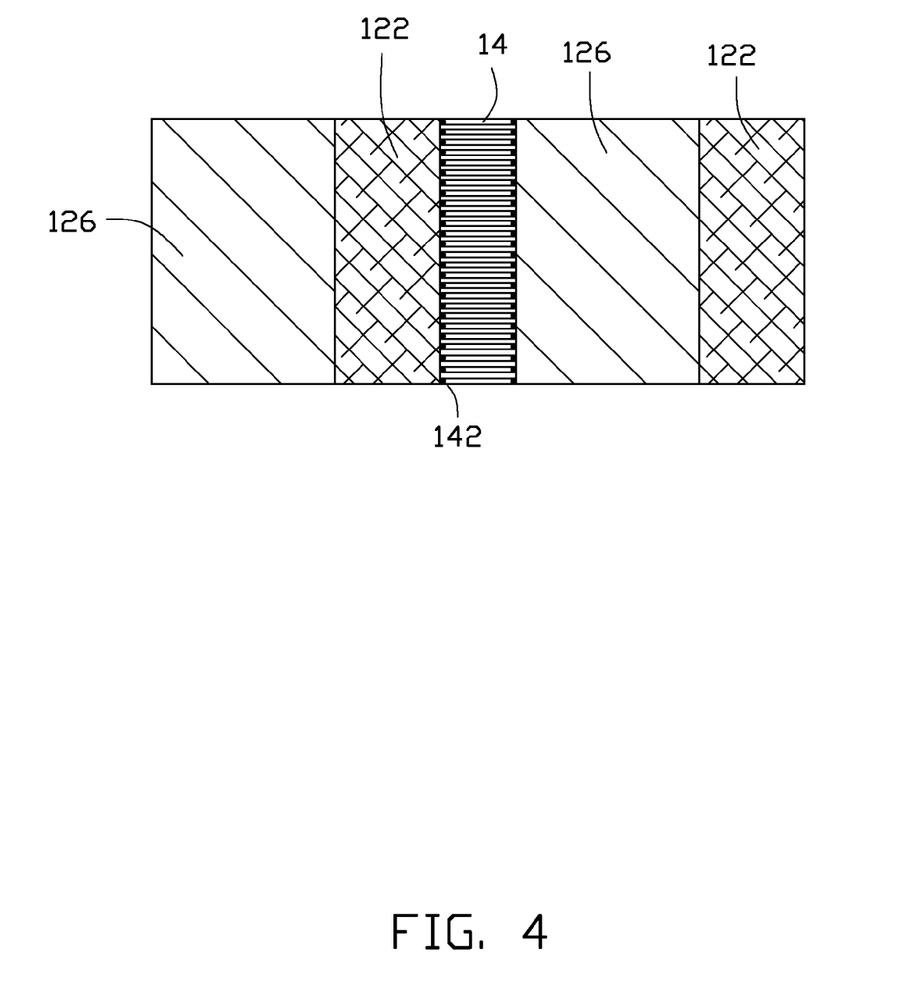
FIG. 4 is a partial, enlarged view of one embodiment of a solar cell system.

Referring to FIG. 4, a metal film 142 may be formed on one ends of the carbon nanotubes of the carbon nanotube array, and the other metal film 143 may be formed on other ends of carbon nanotubes of the carbon nanotube array. The metal film 143 can be deposited by vacuum evaporation or magnetron sputtering. In one embodiment, there is only one metal film which is formed between the carbon nanotube array and the P-N junction cells 12. The metal film 143 includes a number of metal particles. The metal particles are located on the ends of the carbon nanotubes. The metal film 143 may reduce the intermediate resistance between the carbon nanotube array and the P-N junction cell 12. Therefore, the inner resistance of the solar cell system 10 is reduced. The photoelectric conversion efficiency of the solar cell system 10 is improved.

The inner electrodes 14 can be a carbon nanotube array composite including a carbon nanotube array and a non-carbon nanotube conductive material. There are gaps between the carbon nanotubes. The conductive material is located in the gaps. The non-carbon nanotube conductive material may be polymeric complex material or low melting point metal.

The polymeric complex material includes a phase change material and a number of conductive particles dispersed in the phase change material. The phase change material may be silicone rubber, polyester, polyvinyl chloride, polyvinyl alcohol, polyethylene, polypropylene, epoxy resin, polyoxymethylene, polyacetal, or paraffin. The conductive particles may be silver coated glass, silver coated aluminum or silver. The low melting point metal includes tin, copper, indium, lead, antimony, gold, silver, bismuth, aluminum or alloy thereof. The alloy includes tin-lead alloy, indium-tin alloy, tin-silver-copper alloy, Au—Si alloy gold germanium alloy.

The carbon nanotube array composite has a better conductivity than a pure carbon nanotube array. Therefore, the inner resistance of the solar cell system 10 is reduced. The photoelectric conversion efficiency of the solar cell system 10 is improved.

The incident light irradiates the photoreceptive surface of solar cell system 10. The first collecting electrode 16 and the second collecting electrode 18 do not coat the photoreceptive surface 17, namely, the P-N junction is directly exposed from the photoreceptive surface 17. Thus, the photons in the incident light directly reach the P-N junction without passing through the second collecting electrode 18 and the first collecting electrode 16, and can be directly absorbed by the P-N junction. Accordingly, the second collecting electrode 18 and the first collecting electrode 16 do not obstruct the incident light reaching the P-N junction, thereby increasing the light absorbing efficiency of the P-N junction. Correspondingly, the P-N junction can excite more electron-hole pairs under the irradiation of the incident light. In addition, the second collecting electrode 18 can have any shape that will not obstruct light. In one embodiment, the second collecting electrode 18 having a planar shaped structure. The second collecting electrode 18 is coated on the entire second surface 123 of the Mth P-N junction cell. Thus, the second collecting electrode 18 has a large area, thereby decreasing the diffusing distance of the carriers in the second collecting electrode 18 and the interior loss of the carriers, and increasing the photoelectric conversion efficiency of the solar cell system 10. In addition, the M P-N junction cells can be located side by side and connected in parallel. Thus, the solar cell system 10 can apply greater current to external load.

An antireflection layer 19 can be disposed on the photoreceptive surface 17 to decrease reflection of the incident light and increase absorption of the incident light. The antireflection layer 19 can absorb little light. A material of the antireflection layer 19 can be silicon nitride ($Si_3N_4$) or silicon dioxide ($SiO_2$). A thickness of the antireflection layer 19 can be less than 150 nanometers. In one embodiment, the antireflection layer 19 is the silicon nitride layer having the thickness of 900 angstrom (Å).

Furthermore, a reflector 15 can be located on the surface opposite to the photoreceptive surface 17. The reflector 15 can reflect the light emitting from a bottom surface 11 back to the P-N junction cell. If the solar cell system doesn't include the reflector 15, the bottom surface is used as an emitting surface. The reflector 15 can be a reflecting layer. The reflecting layer is contacted with the bottom surface 11 and insulated from the first collecting electrode 16 and the second collecting electrode 18. The reflecting layer is made of metal. The reflecting layer may be a continuous planar shaped. The metal can be aluminum, gold, copper, silver or alloy thereof. A thickness of the reflecting layer is not limited. The thickness of the reflecting layer is greater than 20 micrometers to reflect more lights. In one embodiment, the thickness of the reflecting layer is 20 micrometers.

In one embodiment, if the reflecting layer is conductive, the reflecting layer is spaced from the bottom surface 11 by a transparent insulating layer 13. The transparent insulating layer 13 is located on the entirety of the bottom surface 11. The transparent insulating layer 13 covers the entirety of the bottom surface 11. The reflecting layer is a continuous reflection layer located on the entirety of the transparent insulating layer 13. The reflecting layer covers the entirety of the transparent insulating layer 13. The transparent insulating layer 13 is made of material with a certain chemical stability, such as diamond-like carbon, silicon, silicon carbide, silicon dioxide, silicon nitride, aluminum oxide or boron nitride. The thickness of the transparent insulating layer 13 can be in a range from about 10 nanometers to about 100 micrometers. In one embodiment, the thickness of the transparent insulating layer 13 is in a range from about 10 nanometers to about 50 nanometers in order to reduce the light absorption. The transparent insulating layer 13 can be coated on the bottom surface 11 by physical vapor deposition or chemical vapor deposition (CVD). The reflecting layer can be formed on the transparent insulating layer 13 by vacuum evaporation or magnetron sputtering.

In one embodiment, the reflecting layer and the bottom surface 11 can be spaced from each other, and the reflecting layer and the bottom surface 11 are insulated from each other. A distance between the reflecting layer and the bottom surface 11 is not limited. In one embodiment, the distance between the reflecting layer and the bottom surface 11 is in a range from about 1 millimeter to 5 centimeters. Furthermore, the reflector 15 can include a substrate. The reflecting layer is located on a surface of the substrate. A shape of the substrate is not limited. In one embodiment, the substrate is board-shaped. The shape of the substrate is the same as the shape of the bottom surface 11. The substrate may be made of glass, ceramics, or silicon dioxide. In one embodiment, the substrate is a ceramics board. The reflecting layer can be formed on a surface of the substrate by vacuum evaporation or magnetron sputtering.

The reflector 15 can be a microstructure formed on the bottom surface 11. Shapes of the microstructures can be V-shaped, cylindrical-shaped, hemisphere, sphere, pyramid-shaped, or shapes by slashing a cutting-edge part of a pyramid. The microstructure can be grooves or protrusions. The microstructure is uniformly arranged on the bottom surface 11. The reflector 15 furthermore includes a reflecting film coated on a surface of the microstructure. The reflecting film can be aluminum, aurum, copper, silver or alloy thereof. The reflecting film can be formed by vacuum evaporation or magnetron sputtering. The reflector 15 is used to total reflect the light irradiating on the bottom surface 11. The reflecting light is absorbed by the P-N junction cell.

A thickness of the solar cell system 10 is a distance between the photoreceptive surface 17 and the bottom surface 11. The thickness of the solar cell system 10 is not limited. In one embodiment, the light is total absorbed by the P type silicon layer and the N type silicon layer. Therefore, the light can be effectively absorbed by the solar cell system 10. In one embodiment, the thickness of the solar cell system 10 is about 50 micrometers to about 300 micrometers.

Figure 5:
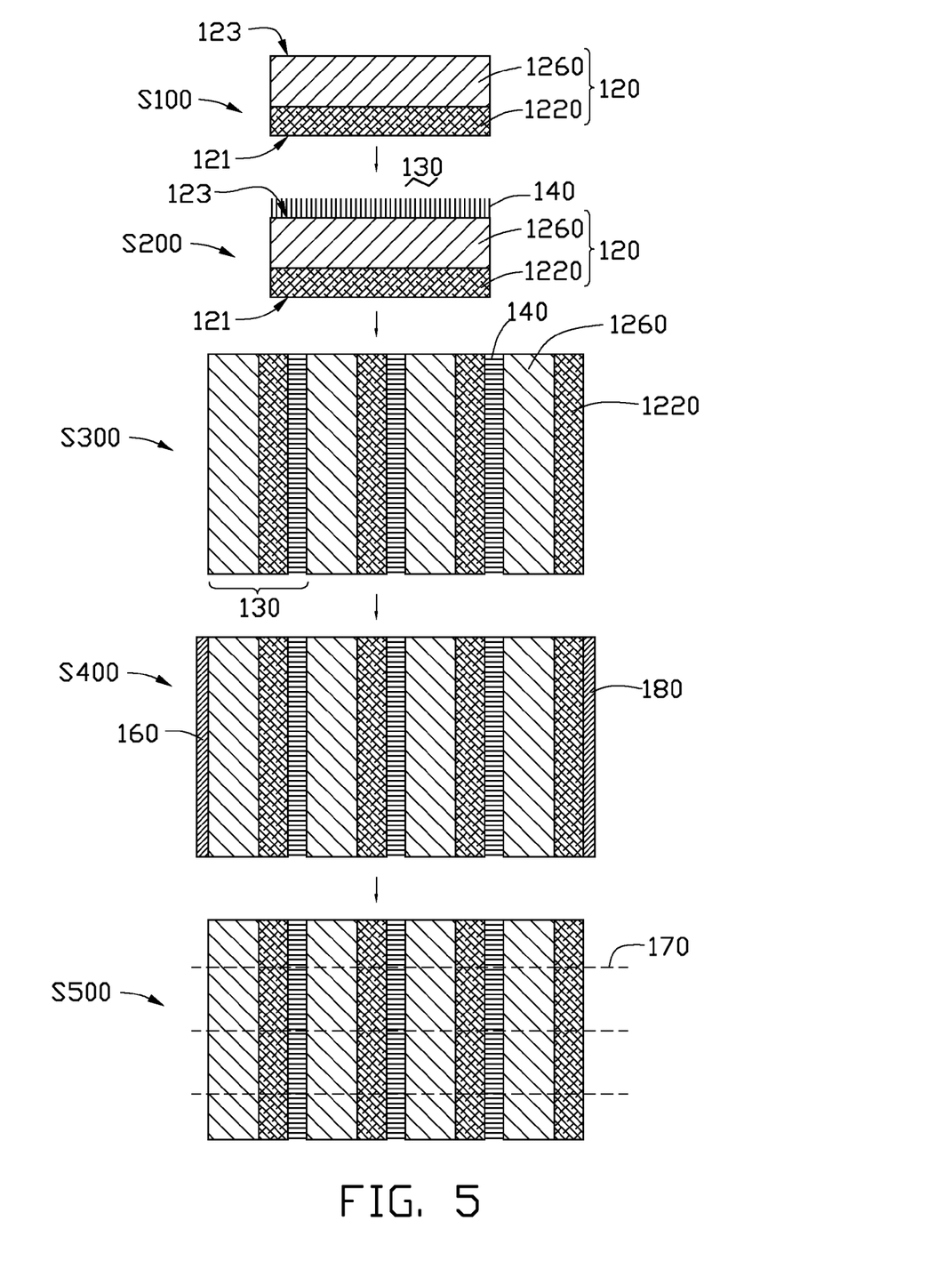
FIG. 5 is a flow chart of a method for making a solar cell system of one embodiment.

Referring to FIG. 5, a method for manufacturing the solar cell system 10 of one embodiment includes the following steps:

S100: proving a number of P-N junction cell preforms 120, wherein the number of the P-N junction cell preforms 120 is M, the M P-N junction cell preforms 120 are named from a first P-N junction cell preform to a Mth P-N junction cell preform, each P-N junction cell preform has a first surface 121 and a second surface 123 opposite to and parallel to the first surface 121;

S200: forming an inner electrode preform 140 on each of the second surface 123 of the P-N junction cell preforms 120 to obtain a number of P-N junction cell structures 130;

S300: laminating the P-N junction cell structures 130 in series to form an integrated structure along a laminating direction perpendicular to the first surface 121 and the second surface 123;

S400: forming a first collecting electrode preform 160 on the second surface 123 of each of the P-N junction cell structures 130 and a second collecting electrode preform 180 on the first surface 121 of the Mth of the P-N junction cell structures 130 to obtain a solar cell system preform; and S500: cutting the solar cell system preform along the cut lines 170 along the laminating direction to obtain a number of solar cell systems 10.

In the step S100, M is natural number. M is greater than or equal to 2.

Each of the P-N junction cell preforms 120 includes a first silicon preform 1220 and a second silicon preform 1260. The first silicon preform 1220 and the second silicon preform 1260 are stacked together and in contact with each other. The first surface 121 belongs to the first silicon preform 1220 and away from the second silicon preform 1260. The second surface 123 belongs to the second silicon preform 1260 and away from the first silicon preform 1220. The first silicon preform 1220 is a P-type silicon substrate or an N-type silicon substrate. The second silicon preform 1260 is a P-type silicon substrate or an N-type silicon substrate. The type of the first silicon preform 1220 is different from the type of the second silicon preform 1260. In one embodiment, the first silicon preform 1220 is the P-type silicon substrate and the second silicon preform 1260 is the N-type silicon substrate.

The first silicon preform 1220 may be made of a single crystal silicon or a multicrystal silicon. In one embodiment, the first silicon preform 1220 is a P-type single crystal silicon. A thickness of the first silicon preform 1220 is in a range from about 200 micrometers to about 300 micrometers. A shape of the first silicon preform 1220 can be selected according to need. The second silicon preform 1260 can be made by injecting superfluous N-type doping elements (e.g. phosphorus or arsenic) into a silicon sheet. A thickness of the second silicon preform 1260 is in a range from about 10 nanometers to about 1 micrometer.

In the step S200, the number of the P-N junction cell structures 130 is M. Each of the P-N junction cell structures 130 includes one of the P-N junction cell preforms 120 and an inner electrode preform. In one embodiment, each of the inner electrode preform 140 is a carbon nanotube array and the carbon nanotube array is located on the second surface 123 of each of the P-N junction cell preforms 120. It can be understood that the inner electrode preform 140 can be formed on the first surface 121 of each of the P-N junction cell preforms 120.

The carbon nanotube array can be formed by chemical vapor deposition. The carbon nanotube array can be a super-aligned carbon nanotube array or an open-ended carbon nanotube array.

The super-aligned carbon nanotube array can be made by the following steps:

Step S202: forming a catalyst layer on the second surface 123 of at least one of the P-N junction cell preforms 120;

Step S204: annealing the catalyst layer at an approximate temperature in a range from about 700° C. to about 900° C. for about 30 minutes to about 90 minutes;

Step S206: placing the P-N junction cell preforms 120 into a reacting furnace and increasing the temperature of the reacting furnace to about 500° C. to about 740° C. wherein a protection gas is flowed into the reacting furnace; and Step S208: flowing a carbon source gas into the reacting furnace for about 5 minutes to about 30 minutes to grow a super-aligned carbon nanotube array.

In the step S202, the catalyst layer is uniformly disposed by means of, e.g., chemical vapor deposition, thermal deposition, electron-beam deposition, or sputtering. The catalyst material can be iron (Fe), cobalt (Co), nickel (Ni), alloys thereof, or oxides including Fe, Co, and/or Ni. In one embodiment, the catalyst layer is made of Fe.

In the step S206, the protection gas may be argon (Ar) gas, nitrogen ($N_2$) gas, hydrogen ($H_2$) gas, ammonia gas ($NH_3$) or other noble gases.

In the step S208, the carbon source gas is a hydrocarbon gas, e.g., ethylene, methane, acetylene, or ethane. In one embodiment, the carbon source gas is acetylene. A height of the carbon nanotube array is about 100 micrometers to 400 micrometers. In one embodiment, the carbon nanotube array is about 150 micrometers. In the super-aligned carbon nanotube array, the carbon nanotubes are contacted to each other by van der Waals force.

A method for making the open-ended carbon nanotube array includes the following steps of:

forming a catalyst layer on a second surface 123 of one of the P-N junction cell preforms 120; placing the P-N junction cell preform 120 having the catalyst layer into a quartz boat wherein the quartz boat has a opening;

placing the quartz boat into a reaction furnace wherein the reaction furnace includes a gas inlet and a gas outlet, the opening of the quartz boat towards the gas inlet; increasing the temperature of the reaction furnace to a predetermined temperature and introducing a carbon source gas into the reaction chamber for growing carbon nanotubes from the catalyst layer; promptly reducing a concentration of the carbon source gas proximate to the catalyst layer when the growth of carbon nanotubes is over, thereby ceasing the growth of the carbon nanotubes instantly. In U.S. Pat. No. 7,625,544, a method how to grow open-ended carbon nanotube array has been described in detail, and the teachings of which are incorporated by reference.

After the growth of the carbon nanotube array, one end of the carbon nanotube array is connected to the second surface 123 of the P-N junction cell preforms 120 and the other end of the carbon nanotube array is a free end. The carbon nanotube array can be grown under a tip growth mechanism or a root growth mechanism. If the growth is under the tip growth mechanism, then a number of metal particles will be remained on the free end of the carbon nanotube array. If the growth is under the root growth mechanism, a number of metal particles will be remained between the carbon nanotube array and the second surface 123 of the P-N junction cell preforms 120. The metal particles are residue of the catalyst layer. After the step S300, all the metal particles will be located between the carbon nanotube array and the P-N junction cell preforms 120. The intermediate resistance between the carbon nanotube array and the P-N junction cell preforms 120 will be reduced for the good conductivity of the metal particles. Therefore, the inner resistance of the solar cell system 10 is reduced. The photoelectric conversion efficiency of the solar cell system 10 is enhanced.

It can be understood that after the root growth mechanism, the metal particles will be remained between the carbon nanotube array and the second surface 123 of the P-N junction cell preforms 120, a first metal film can also be deposited on the free end of the carbon nanotube array. The first metal film can be made by vacuum evaporation or magnetron sputtering. The metal particles can also constitute a second metal film. Therefore, after the step S300, the first metal film and the second metal film can be located between the carbon nanotube array and two of the P-N junction cell preforms 120 adjacent to the carbon nanotube array. The intermediate resistance between the carbon nanotube array and the two P-N junction cell preforms 120 adjacent the carbon nanotube array will be reduced for the good conductivity of the first metal film and the second metal film. Therefore, the inner resistance of the solar cell system 10 is reduced. The photoelectric conversion efficiency of the solar cell system 10 is enhanced.

Furthermore, after the growth of the carbon nanotube array, a conductive material can be formed in the inner of the carbon nanotube array to obtain a carbon nanotube composite. A method for making the carbon nanotube composite includes the following steps:

providing a mold with a molten conductive material located in the inner of the mold;

dipping the carbon nanotube array growth on the P-N junction cell preforms 120 into the molten conductive material wherein the molten conductive material fills into gaps between the carbon nanotubes of the carbon nanotube array;

and cooling the molten conductive material and removing the mold.

In the step S300, the P-N junction cell structures 130 can be bonded together by the fulmargin. In one embodiment, the fulmargin is formed on the four edges of the first surface 121 of the P-N junction cell preforms 120 of each of the P-N junction cell structures 130. After laminating the P-N junction cell structures 130, adjacent two of the P-N junction cell structures 130 are bonded together by the fulmargin. In addition, the laminated P-N junction cell structures 130 are pressed together by a pressing device to combine the laminated P-N junction cell structures 130. Referring to FIG. 4, the carbon nanotube arrays are curved under a pressure applied by the pressing device after the laminated P-N junction cell structures 130 are pressed.

In the step S400, the first collecting electrode preform 160 is formed on the second surface 123 of first of the P-N junction cell preforms 120. The second surface 123 of the first of the P-N junction cell preforms 120 is an outside surface of the laminated P-N junction cell structures 130 along the laminating direction. In the step S200, the carbon nanotube array has grown on the second surface 123 of the first of the P-N junction cell preforms 120. Therefore, the carbon nanotube array can be used as the first collecting electrode preform 160 alone. Furthermore, a metal film can be formed on the free end of the carbon nanotube array formed on the second surface 123 of the first of the P-N junction cell preforms 120. The metal film can be formed by vacuum evaporation or magnetron sputtering. The carbon nanotube array grown on the second surface 123 of the first of the P-N junction cell preforms 120 and the metal film formed on the carbon nanotube array are jointly used as the first collecting electrode preform 160. The metal film formed on the free end of the carbon nanotube array can protect the carbon nanotube array from damage. Furthermore, the carbon nanotube array grown on the second surface 123 of the first of the P-N junction cell preforms 120 can be removed and a metal film can be formed on the second surface 123 of the first of the P-N junction cell preforms 120 directly.

The second collecting electrode preform 180 may be a continuous planar-shaped structure. The material of the second collecting electrode preform 180 may be a metal or a carbon nanotube array. The material of the metal can be aluminum, copper, or silver. The second collecting electrode preform 180 is adhered on the first surface 121 of the Mth of the P-N junction cell preforms 120 by conductive adhesive. The second collecting electrode preform 180 can also be formed by vacuum evaporation or magnetron sputtering. In one embodiment, the second collecting electrode preform 180 is a strip-shaped aluminum. The first collecting electrode preform 160 and the second collecting electrode preform 180 are opposite to and spaced from each other. Both of the first collecting electrode preform 160 and the second collecting electrode preform 180 are connected to the photoreceptive surface 17.

In the step S500, methods of cutting the laminated P-N junction cell structures 130 can be varied. A cutting direction runs through the every one of the P-N junction cell structures 130 to form a number of planar shaped structures. The cutting direction is parallel to the laminating direction and perpendicular to a surface parallel to the first collecting electrode preform 160 and the second collecting electrode preform 180. After the step 500, a number of solar cell system 10 are obtained. A surface of the cutting path is defined as a cutting surface. The cutting surface can be defined as the photoreceptive surface 17.

Furthermore, in the obtained solar cell system in FIG. 1, an antireflection layer 19 can be formed on the photoreceptive surface 17. The antireflection layer 19 can be made by vacuum evaporation or magnetron sputtering. In one embodiment, the antireflection layer 19 is a silicon nitride layer. A thickness of the antireflection layer 19 is about 900 Å.

Furthermore, a reflection layer may be formed on the bottom surface 11 of the solar cell system 10. An insulating layer 13 can be formed between the bottom surface 11 and the reflection layer. A thickness of the insulating layer 13 may be in a range from about 5 nanometers to 15 nanometers. The insulating layer 13 is made of silicon dioxide, diamond, resin and plastic.

The method for making the solar cell system 10 has the following benefits: first, the carbon nanotube arrays are grown by CVD, therefore, a number of metal particles will remain, and the metal particles will be located between the carbon nanotube array. The intermediate resistance between the carbon nanotube array and the P-N junction cells 12 will be reduced. A photoelectric conversion efficiency of the solar cell system 10 will be enhanced. Secondly, the carbon nanotube array are extended from the first surface 121 of one P-N junction cell to the second surface 123 of the other one P-N junction cell adjacent the one P-N junction cell along the axial direction of the carbon nanotubes. Therefore, the current is conductive along the axial direction of the carbon nanotubes, the resistance of the carbon nanotubes is low, thus, the inner resistance of the solar cell is low and the photoelectric conversion efficiency of the solar cell system 10 will be enhanced. Thirdly, the carbon nanotube array is grown on the surface of the P-N junction cell preform. Therefore, the bonding force between the carbon nanotube array and the P-N junction cell is strong, and the solar cell is obtained by laminating the P-N junction cell structures 130 and cutting. Thus the method is effective.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A solar cell system manufacturing method, the method comprises steps of:
    S100: providing a plurality of P-N junction cell preforms comprising M number of P-N junction cell preforms, M being greater than or equal to 2, the plurality of P-N junction cell preforms being labeled as a first P-N junction cell preform, a second P-N junction cell preform, so forth, and a Mth P-N junction cell preform; each of the plurality of P-N junction cell preforms comprises a first silicon preform, a second silicon preform stacked with the first silicon preform, a first surface of the first silicon preform away from the second silicon preform, and a second surface of the second silicon preform away from the first silicon preform;
    S200: arranging the plurality of P-N junction cell preforms from the first P-N junction cell preform to the Mth P-N junction cell preform along a straight line;
    S300: forming at least one inner electrode preform of carbon nanotubes between adjacent two of the plurality of P-N junction cell preforms, the at least one inner electrode preform comprising an array of carbon nanotubes comprising a plurality of carbon nanotubes, and axial directions of the plurality of carbon nanotubes in the array of carbon nanotubes being parallel to the straight line;
    S400: forming an inner electrode preform between remaining adjacent two of the plurality of P-N junction cell preforms;
    S500: forming a first collecting electrode preform on an outside surface of the first P-N junction cell preform and forming a second collecting electrode on an outside surface of the Mth P-N junction cell preform to obtain a solar cell system preform; and
    S600: cutting the solar cell system preform along the straight line to obtain a plurality of solar cell systems.

2. The solar cell system manufacturing method of claim 1, wherein in the step S600, the solar cell system preform is cut by laser.

3. The solar cell system manufacturing method of claim 1, comprising S700: forming photoreceptive surfaces parallel to the straight line and forming emitting surfaces opposite to the photoreceptive surfaces by cutting the solar cell system preform into a plurality of slices.

4. The solar cell system manufacturing method of claim 3, the step S700 further comprises forming an antireflection layer on the photoreceptive surfaces.

5. The solar cell system manufacturing method of claim 3, the step S700 further comprises forming a reflector on the emitting surfaces of the solar cell system.

6. The solar cell system manufacturing method of claim 5, the step S700 further comprises forming a transparent insulating layer between the reflector and the emitting surfaces.

7. The solar cell system manufacturing method of claim 1, the step S300 comprises:

forming the at least one inner electrode preform of carbon nanotubes on the second surface or the first surface of the plurality of P-N junction cell preforms to obtain at least one P-N junction cell structures of carbon nanotubes;

the step S400 comprises the following substeps:
  forming the inner electrode preform on the second surface or the first surface of remaining of the plurality of P-N junction cell preforms to obtain a plurality of P-N junction cell structures; and the solar cell system manufacturing method further comprises:

S450: laminating at least one P-N junction cell structure of carbon nanotubes and the plurality of P-N junction cell structures in series to form an integrated structure along the straight line.

8. The solar cell system manufacturing method of claim 1, the step S400 further comprises growing the array of carbon nanotubes on the second surface or the first surface of each of the remaining of the plurality of P-N junction cell preforms.

9. The solar cell system manufacturing method of claim 1, wherein in the step S300, the array of carbon nanotubes is formed by chemical vapor deposition.

10. The solar cell system manufacturing method of claim 1, wherein the step S300 comprises the following substeps:
  growing the array of carbon nanotubes on the second surface or the first surface; and
  forming a metal layer on free ends of the carbon nanotubes of the array of carbon nanotubes.

11. The solar cell system manufacturing method of claim 10, wherein metal layer is deposited by vacuum evaporation or magnetron sputtering.

12. The solar cell system manufacturing method of claim 1, wherein the step S300 comprises the following substeps:
  growing the array of carbon nanotubes on the second surface or the first surface; and
  filling inner spaces of the carbon nanotubes of the array of carbon nanotubes with a conductive material.

13. The solar cell system manufacturing method of claim 12, wherein the step of filling the conductive material into the inner spaces of the carbon nanotubes comprises the following substeps:
  dipping the array of carbon nanotubes grown on the second surface or the first surface into a molten conductive material so that the molten conductive material fills into gaps between the carbon nanotubes of the array of carbon nanotubes; and
  cooling the array of carbon nanotubes with gaps filled with the molten conductive material.

14. The solar cell system manufacturing method of claim 12, wherein the conductive material is polymeric complex material or a metal of a low melting point.

15. A solar cell system manufacturing method, the method comprises steps of:

S100: providing a plurality of P-N junction cell preforms comprising M number of P-N junctions cell preforms, the plurality of P-N junction cell preforms being labeled as a first P-N junction cell preform, a second P-N junction cell preform, so forth, and a Mth P-N junction cell preform, each of the plurality of P-N junction cell preforms comprising a first silicon preform and a second silicon preform stacked with the first silicon preform;

S200: arranging the plurality of P-N junction cell preforms from the first P-N junction cell preform to the Mth P-N junction cell preform along a straight line;

S300: forming an array of carbon nanotubes between each adjacent two of the plurality of P-N junction cell preforms, the array of carbon nanotubes comprising a plurality of carbon nanotubes, axial directions of the plurality of carbon nanotubes in the array of carbon nanotubes being parallel to the straight line;

S400: forming a first collecting electrode preform on an outside surface of the first P-N junction cell preform and forming a second collecting electrode preform on an outside surface of the Mth P-N junction cell preform to obtain a solar cell system preform; and S500: cutting the solar cell system preform along the straight line.

16. The solar cell system manufacturing method of claim 15, the step 400 further comprising depositing the first collecting electrode preform on an entire surface of the outside surface of the first P-N junction cell preform, and depositing the second collecting electrode preform on an entire surface of the outside surface of the Mth P-N junction cell preform.

17. A solar cell system manufacturing method, the method comprises steps of:
  S100: providing a plurality of P-N junction cell preforms comprising M number of P-N junction cell preforms, M being greater than or equal to 2, the plurality of P-N junction cell preforms being labeled from a first P-N junction cell preform, a second P-N junction cell preform, so forth, and a Mth P-N junction cell preform, each of the plurality of P-N junction cell preforms comprising a first silicon preform and a second silicon preform stacked with the first silicon preform;

S200: arranging the plurality of P-N junction cell preforms from the first P-N junction cell preform to the Mth P-N junction cell preform along a straight line; and S300: forming an inner electrode preform between each adjacent two of the plurality of P-N junction cell preforms, the inner electrode preform comprising at least one inner electrode preform of an array of carbon nanotubes of a plurality of carbon nanotubes, axial directions of the plurality of carbon nanotubes in the array of carbon nanotubes being parallel to the straight line.

* * * * *